United States Patent
Masson et al.

(10) Patent No.: US 9,979,396 B1
(45) Date of Patent: May 22, 2018

(54) BIDIRECTIONAL ANALOG MULTIPLEXER

(71) Applicant: STMicroelectronics (Grenoble 2) SAS, Grenoble (FR)

(72) Inventors: Thierry Masson, Varces (FR); Pawel Fiedorow, Grenoble (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 0 days. days.

(21) Appl. No.: 15/679,933

(22) Filed: Aug. 17, 2017

(30) Foreign Application Priority Data

Feb. 23, 2017 (FR) ...................................... 17 51414

(51) Int. Cl.
| | |
|---|---|
| *H03K 19/0175* | (2006.01) |
| *H03K 19/018* | (2006.01) |
| *H01L 29/66* | (2006.01) |
| *H03K 17/693* | (2006.01) |
| *H03K 17/16* | (2006.01) |
| *G06F 11/20* | (2006.01) |
| *H01L 29/06* | (2006.01) |

(52) U.S. Cl.
CPC . *H03K 19/01843* (2013.01); *H01L 29/66659* (2013.01); *H03K 17/693* (2013.01); *G06F 11/20* (2013.01); *H01L 29/0661* (2013.01); *H03K 17/165* (2013.01)

(58) Field of Classification Search
CPC ....... H03K 19/01759; H03K 19/01843; H03K 19/018592; H03K 17/693; H03K 5/026
See application file for complete search history.

(56) References Cited

U.S. PATENT DOCUMENTS

| | | | | |
|---|---|---|---|---|
| 5,854,566 | A * | 12/1998 | Kwon | H01L 29/7833 257/E29.266 |
| 6,114,897 | A | 9/2000 | Ham | |
| 6,509,860 | B2 * | 1/2003 | Saito | G11C 27/02 327/403 |
| 8,149,042 | B2 * | 4/2012 | Nakahara | H03K 17/063 327/308 |
| 9,520,869 | B2 * | 12/2016 | Fiedorow | H03K 17/162 |
| 2010/0225379 | A1 | 9/2010 | Ramet | |
| 2016/0204780 | A1 * | 7/2016 | Tokai | H03K 17/6871 327/408 |
| 2017/0040990 | A1 * | 2/2017 | Anand | H03K 17/693 |

FOREIGN PATENT DOCUMENTS

| DE | 19548612 A1 | 6/1997 |
|---|---|---|
| FR | 3030155 A1 | 6/2016 |

OTHER PUBLICATIONS

INPI Search Report and Written Opinion for FR 1751414 dated Oct. 18, 2017 (13 pages).

* cited by examiner

*Primary Examiner* — Jason M Crawford
(74) *Attorney, Agent, or Firm* — Crowe & Dunlevy

(57) ABSTRACT

An analog multiplexer includes inputs and one output. A switching circuit is coupled between each input and the output. Each switching circuit includes an NMOS switching module, having an on state and an off state, and a control module supplied by a first supply voltage and operating to reduce leakage currents of the NMOS switching module when in the off state. The control module further operates to make the first NMOS switching module bidirectional irrespective of voltages present at the input and at the output.

17 Claims, 4 Drawing Sheets

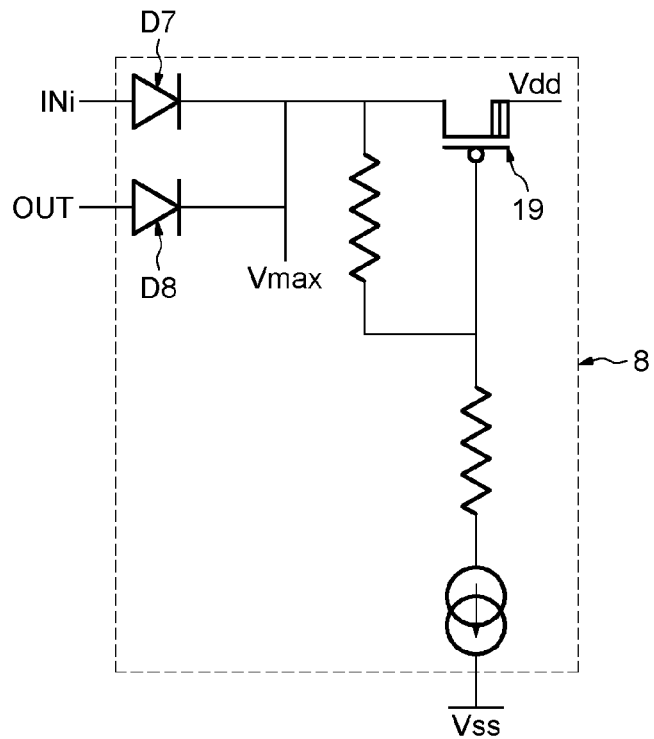

BIDIRECTIONAL ANALOG MULTIPLEXER

PRIORITY CLAIM

This application claims the priority benefit of French Application for Patent No. 1751414, filed on Feb. 23, 2017, the disclosure of which is hereby incorporated by reference in its entirety to the maximum extent allowable by law.

TECHNICAL FIELD

Embodiments relate to analog multiplexers, and more particularly to analog multiplexers capable of transmitting high-voltage signals bidirectionally with low drive voltages, while being compatible with a so-called "cold spare" mode well known to the person skilled in the art.

BACKGROUND

In general, an analog multiplexer has a plurality of inputs, respectively coupled to one output via corresponding internal channels.

Each corresponding internal channel conventionally has a driveable circuit produced in an integrated fashion, such as a switching circuit under the control of at least one corresponding drive signal.

When an internal channel is selected by means of the at least one corresponding drive signal, the analog multiplexer allows transmission of data from the corresponding input of the first group and the terminal of the second group.

When the multiplexer is operating in the so-called "cold spare" mode, the power supply of this multiplexer is cut off completely, but the multiplexer can receive one or more external signals at its inputs or at its output, these being delivered for example by another multiplexer in normal operation.

In general, the multiplexer compatible with the so-called "cold spare" mode is configured so as not to be damaged by the signal or signals present at its inputs and/or at its output, while minimizing current consumptions at its inputs and at its output.

U.S. Pat. No. 9,520,869, incorporated by reference, is known from the prior art, and describes an analog multiplexer where the high-voltage analog switching circuits are compatible with a low-voltage drive technology and the so-called "cold spare" mode. The analog switching circuits are furthermore configured in order to ensure linearity and operation of the switching circuits and to reduce as much as possible the leakage currents of the switching circuits when the latter are in their off state.

In certain situations of voltages present at the input and at the output, however, the corresponding switching circuits may be off, which makes the multiplexer not entirely bidirectional.

Furthermore, this multiplexer of the prior art does not have any circuit for protection against a possible excessively high current flowing in one of the switching circuits, running the risk of destroying the corresponding switching circuit.

There is thus a need to provide an analog multiplexer which is fully bidirectional while furthermore preferably having protection against a short circuit at the input or at the output of any one of its switching circuits, which might give rise to a high current flowing in the corresponding switching circuit.

SUMMARY

According to one aspect, an analog multiplexer is provided which comprises a plurality of inputs and one output, and a plurality of switching circuits respectively coupled between the inputs and the output. Each switching circuit comprises: a first switching module of the NMOS type, having an on state and an off state, and a first control module intended to be supplied with a first supply voltage and configured in order to reduce the leakage currents of the first switching module when the first switching module is in its off state.

According to a general characteristic of this aspect, the first control module is furthermore configured in order to make the first switching module bidirectional irrespective of the voltages present at the corresponding input and at the output.

Thus, bidirectionality of the multiplexer is obtained by acting on the first switching modules.

The first switching module of the corresponding switching circuit may, for example, have at least one NMOS transistor, and the first control module may, for example, comprise a first input unit coupled to the input of the corresponding switching circuit and to the output and configured in order, when the first switching module is in its on state, to deliver to the gate of the at least one NMOS transistor of the first switching module a first gate voltage greater than the highest of the voltages present at the corresponding input and at the output and less than the first supply voltage.

By virtue of this, the on/off state of each first switching module is advantageously controlled while taking into account the voltages present not only at the corresponding input but also at the output, so as to make each first switching module bidirectional throughout its dynamic range of the input and output signals.

By way of non-limiting indication, the first gate voltage may be equal to the sum of the highest of the voltages present at the corresponding input and at the output and a threshold voltage of a diode.

According to one embodiment, the first switching module comprises two extended-drain NMOS transistors connected in series between the input and the output and having their sources and substrates mutually connected.

According to another embodiment, the first input unit has: a first extended-drain PMOS transistor, of which the gate is coupled to the corresponding input, the drain is coupled to the ground and the source is intended to be coupled to the first supply voltage via a first network, comprising at least one diode, and a first current source, a second extended-drain PMOS transistor, of which the gate is coupled to the output, the drain is coupled to the ground and the source is intended to be coupled to the first supply voltage via a second network, comprising at least one diode, and a second current source, a third extended-drain NMOS transistor, of which the gate is coupled between the first current source and the first network of diode(s), the drain is coupled to the ground via a third diode and a third current source, and the source is coupled to the first supply voltage via a fourth diode, the cathode of the third diode being coupled to the gates of the two NMOS transistors of the first switching module, and a fourth extended-drain NMOS transistor, of which the gate is coupled between the second current source and the second network of diode(s), the drain is coupled to the ground via a fifth diode and the third current source, and the source is coupled to the first supply voltage via a sixth diode, the cathode of the fifth diode also being coupled to the gates of the two NMOS transistors of the first switching module.

By way of non-limiting example, the first control module may furthermore comprise a first drive unit which is driveable by a first binary drive signal and is configured in order, when the first binary drive signal has a first logical value, to set the gates and the substrates of the NMOS transistors of the first switching module to the ground, so as to place the latter in its off state.

According to yet another embodiment, each switching circuit is coupled to the corresponding input via a first resistive circuit and to the output via a second resistive circuit, the first and second resistive circuits being configured in order to protect each switching circuit against a short circuit at its input or at its output.

Advantageously, the first and second resistive circuits may reduce the current flowing in the corresponding switching circuit, as well as the maximum voltage which can be applied to each switching circuit in its on state.

Each switching circuit may, for example, furthermore comprise: a second switching module of the PMOS type, having an on state and an off state and connected, in parallel with the first switching module, between the corresponding input and the output, and a second control module intended to be supplied with a second supply voltage and configured in order to reduce the leakage currents of the second switching module when the second switching module is in its off state.

Each switching circuit may, for example, furthermore comprise at least one voltage selection circuit configured in order to deliver the second supply voltage equal to the greatest of the first supply voltage and the voltages present at the corresponding input and at the output.

By way of non-limiting example, the sum of the resistances of the first and second resistive circuits may be greater than or equal to four fifths of the overall resistance of the corresponding switching circuit in the on state, and the resistances of the first and second switching modules may respectively be less than or equal to one fifth of the overall resistance.

According to one embodiment, the second switching module comprises two extended-drain PMOS transistors connected in series between the corresponding input and the output and having their sources and substrates mutually connected.

The second control module may be driveable by a second binary drive signal and may be configured in order, when the second binary drive signal has a first logical value, to set the gates and the substrates of the PMOS transistors of the second switching module to the second supply voltage, so as to place the latter in its off state.

The second control module may furthermore be configured in order, when the second binary drive signal has its second logical value corresponding to an on state of the second switching module, to leave the sources and substrates of the PMOS transistors of the second switching module floating and to apply a second gate voltage, similar to the first supply voltage, to the gates of these PMOS transistors of the second switching module.

The first binary drive signal and the secondary binary drive signal may, for example, be complementary signals.

According to another embodiment, the first and second control modules are furthermore configured so that, when the first supply voltage is zero, the two switching modules are off and any current consumption at the corresponding input and at the output is zero.

According to yet another embodiment, the first and second control modules are furthermore configured so that, when the first supply voltage is zero, the two switching modules are off and any current consumption at the corresponding input and at the output is less than a threshold of the order of 0.1% of a normal current consumption in the presence of a nonzero first supply voltage.

By way of indication, the at least one voltage selection circuit may comprise an additional extended-drain PMOS transistor, of which the gate is connected to its source by an additional resistor and supplied by an additional current source, the source of the additional transistor being connected to the input and to the output by seventh and eighth reverse-biased diodes and intended to deliver the second supply voltage.

The analog multiplexer may advantageously be produced in an integrated fashion.

BRIEF DESCRIPTION OF THE DRAWINGS

Other advantages and characteristics of the invention will become apparent on studying the detailed description of embodiments, which are taken by way of nonlimiting examples and are illustrated by the appended drawings, in which:

FIG. 3 illustrates a voltage selection circuit;
and
FIGS. 4 to 5 illustrate a diagram of the allocation of the pins of the analog multiplexer.

DETAILED DESCRIPTION

Figure 1:
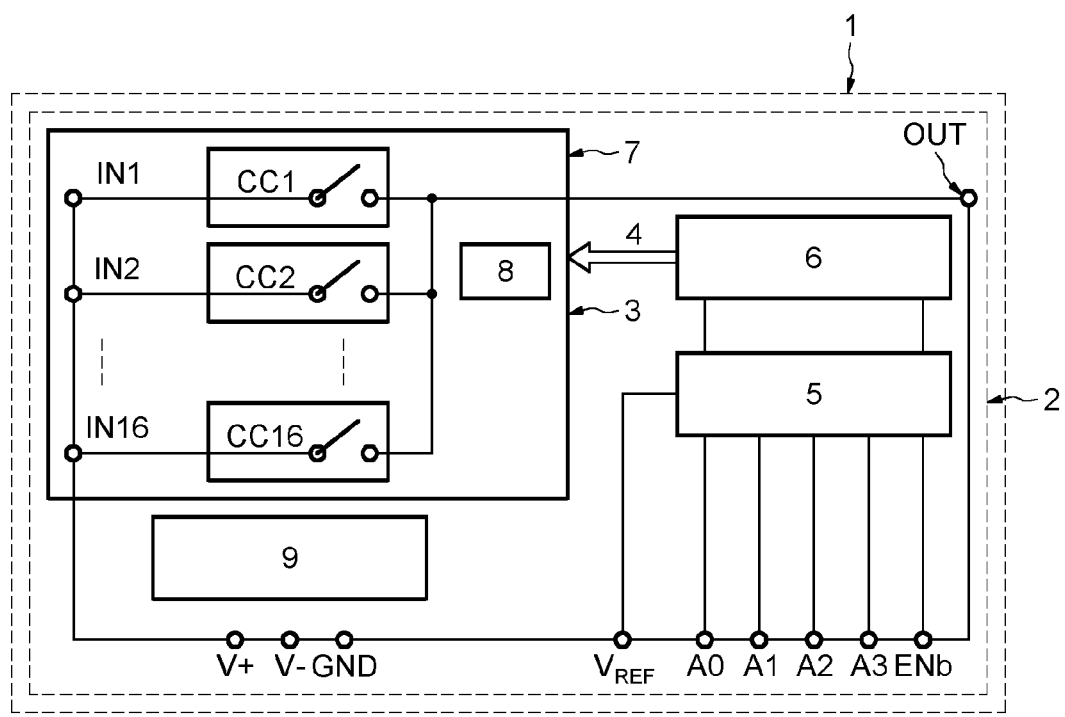
FIG. 1 shows a diagram of an analog multiplexer.

FIG. 1 shows a diagram of the various stages of an analog multiplexer 2, for example having 16 channels, incorporated within an integrated circuit 1.

The multiplexer has a switching stage 3. The switching stage 3 contains a plurality of switching circuits CCi associated with the corresponding channels, for example 16 switching circuits CC1 to CC16, and connected between a plurality of input terminals IN1 to IN16 and one output OUT.

Depending on a selection signal 4 applied to the corresponding channel, the corresponding switching circuit CCi is on in order to transmit an input signal of the corresponding channel to the output of the analog multiplexer, or alternatively is off.

An address input and level conversion stage 5 receives the digital address A0 to A3 of a channel to be processed, an activation signal ENb and a reference signal $V_{REF}$ at its inputs. The activation signal is then converted into the selection signal 4.

A decoding stage 6 then transmits the selection signal 4 to the corresponding analog switching circuit CCi of the channel to be processed, depending on the digital address received from the preceding stage 5.

Advantageously, the switching stage 7 also has a voltage selection circuit 8 configured in order to ensure correct operation of the analog multiplexer, particularly in the so-called "cold spare" mode. The architecture and the operation of the voltage selection circuit 8 will be described in detail below.

The analog multiplexer 2 furthermore has a protection stage 9 protecting the entire analog multiplexer 2 against possible electrostatic discharges.

Since all the switching circuits CC1 to CC16 contained in the switching stage 7 are identical, one of the switching circuits CCi will now be described with reference more particularly to FIGS. 2 to 3.

Figure 2:
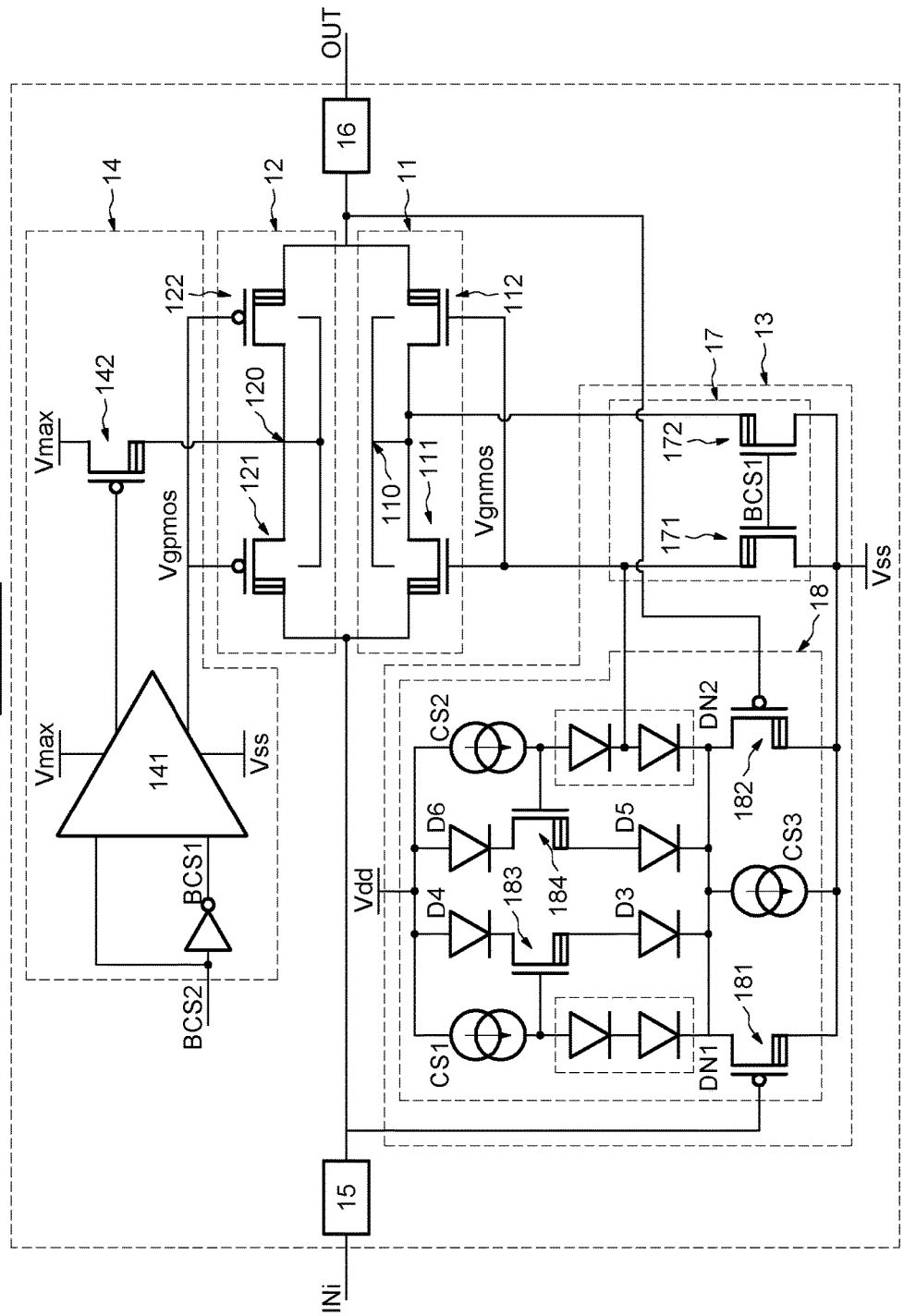
FIG. 2 illustrates an arbitrary switching circuit.

FIG. 2 illustrates an arbitrary one CCi of the switching circuits CC1 to CC16, which has: a first switching module of the NMOS type 11, having an on state and off state, a second switching module of the PMOS type 12, having an on state and off state, a first control module 13 dedicated to the first switching module of the NMOS type 11, and a second control module 14 dedicated to the second switching module of the PMOS type 12.

In fact, the selection signal 4 comprises in this case a first binary drive signal BCS1 and a second binary drive signal BCS2. The two signals BCS1 and BCS2 are complementary, as will be seen in more detail below.

When the multiplexer 2 is in a normal operating mode, that is to say supplied with a nonzero supply voltage Vdd, and the first binary drive signal BCS1 is in the low state, and the second binary signal BCS2 is consequently in the high state, the switching circuit CCi is in its on state.

Conversely, when the first binary drive signal BCS1 is in the high state, and the second binary drive signal BCS2 is consequently in the low state, the switching circuit CCi is in its off state.

The first and second switching modules 11 and 12 are connected in parallel between the corresponding input INi and the output OUT. This structure, having on the one hand an NMOS switch and on the other hand a PMOS switch, advantageously makes it possible to ensure operation of the switching circuit CCi throughout the dynamic range of the input signals, here for example of the order of 0 to 16 volts.

The first switching module 11 comprises two extended-drain NMOS transistors 111 and 112, having a structure which is conventional and known per se, which are connected in series between the corresponding input INi and the output OUT. The sources and substrates of the two NMOS transistors 111 and 112 are mutually connected.

Similarly, the second switching module 12 has two extended-drain PMOS transistors 121 and 122 connected in series between the corresponding input INi and the output OUT and having their sources and substrates mutually connected.

Thus, the first and second switching modules 11 and 12 can support high-voltage input and output signals, here for example up to 16 V.

The use of the extended-drain transistors 111, 112, 121 and 122 makes it possible to support such high-voltage input signals (for example up to 16 volts) while using a low-voltage technology in order to supply the gates of these transistors (typically of the order of a few volts).

The input and output impedances of the switching modules 11 and 12 are also high in the off state, because the corresponding input INi and the output OUT of the first and second switching modules 11 and 12 are connected to the drains of the extended-drain transistors 111, 112, 121 and 122.

In order to avoid possible high currents flowing in the first and second switching modules 11 and 12 in the on state, the first and second switching modules 11 and 12 are preferably coupled to the corresponding input INi via a first resistive circuit 15 and to the output OUT via a second resistive circuit 16.

The first and second resistive circuits 15 and 16 advantageously make it possible to protect the first and second switching modules 11 and 12 against a possible short circuit at the corresponding input INi or at the output OUT, which might lead to a maximum voltage of up to 16 volts between the corresponding input INi and the output OUT.

By way of non-limiting example, the total resistance of the first and second resistive circuits 15 and 16 is at least four fifths of the overall resistance in the on state between the corresponding input INi and the output, and any one of the first and second switching modules 11 and 12 is therefore at most one fifth of the overall resistance in the on state. In a case in which the overall resistance in the on state is equal to 2500 ohms, the total resistance of the first and second resistive circuits is equal to or greater than 2 kiloohms. The respective resistances of the first and second resistive circuits may be identical or different.

For this reason, the current flowing in the first and second switching modules 11 and 12 in their on state and the voltage between the first and second terminals B1 and B2 of the first and second switching modules 11 and 12 are thus limited so as to protect the switching modules 11 and 12 against an overvoltage or a short circuit at the corresponding input INi or the output.

Furthermore, as the sources and substrates of the extended-drain transistors 111, 112, 121 and 122 of each switching module are mutually connected to an internal node 110 and 120 (a circuit arrangement referred to by the person skilled in the art as a "back to back switch"), the gate-source and substrate-source voltages of the extended-drain transistors 111, 112, 121 and 122 can be controlled, which makes it possible to obtain a high linearity for the first and second switching modules and to reduce as much as possible the leakage currents when the switching modules are in their off state, as will be seen in more detail below.

The first control module 13 as shown in FIG. 2 comprises a first drive unit 17, which can be driven by the first binary drive signal BCS1 and has two auxiliary extended-drain NMOS transistors 171 and 172. The drain of the auxiliary NMOS transistor 171 is connected to the gates of the two extended-drain NMOS transistors 111 and 112 of the first switching module 11. The drain of the auxiliary NMOS transistor 172 is connected to the sources and substrates of the two extended-drain NMOS transistors 111 and 112 of the first switching module 11. The gates of the auxiliary NMOS transistors 171 and 172 can be driven by the first binary drive signal BCS1, and the sources of these auxiliary transistors are connected to the ground Vss.

When the first binary drive signal BCS1 has a first logical value, for example 3.3 V (high state), the auxiliary NMOS transistors 171 and 172 are in their on state, and the gates and the substrates of the NMOS transistors 111 and 112 of the first switching module 11 are therefore set to the ground Vss.

Consequently, the NMOS transistors 111 and 112 of the first switching module 11 are off, and the first switching module 11 is then placed in its off state. The leakage currents are advantageously limited because the gates, sources and substrates of the NMOS transistors 11 and 12 are set to the ground.

The first control module 17 furthermore comprises a first input unit 18 having:

a first extended-drain PMOS transistor 181, of which the gate is coupled to the corresponding input INi via the first resistive circuit 15, the drain is coupled to the ground Vss and the source is intended to be coupled to the first supply voltage Vdd via a first network DN1, comprising at least one diode, here for example two diodes and a first current source CS1, a second extended-drain PMOS transistor 182, of which the gate is coupled to the output OUT via the second resistive circuit 16, the drain is coupled to the ground Vss and the source is intended to be coupled to the first supply voltage Vdd via a second network DN2, comprising at least one diode, and a second current source CS2, a third extended-drain NMOS transistor 183, of which the gate is coupled between the first current source CS1 and the first network of diode(s) DN1, the drain is coupled to the ground Vss via a third diode D3 and a third current source CS3, and the source is coupled to the first supply voltage Vdd via a fourth diode D4, the cathode of the third diode D3 being coupled to the gates of the two NMOS transistors 111 and 112 of the first switching module 11, and a fourth extended-drain NMOS transistor 184, of which the gate is coupled between the second current source CS2 and the second network of diode(s) DN2, the drain is coupled to the ground Vss via a fifth diode D5 and the third current source CS3, and the source is coupled to the first supply voltage Vdd via a sixth diode D6, the cathode of the fifth diode D5 also being coupled to the gates of the two NMOS transistors 111 and 112 of the first switching module 11.

It should be noted that the diodes D3 to D6 are high-voltage diodes and are configured in order to protect the third and fourth NMOS transistors 183 and 184. Furthermore, the dimensions of the four transistors 181 to 184 and the three current sources are, for example, identical in this case.

In a case in which the difference between the voltages present at the corresponding input INi and at the output is high, the voltage present at the corresponding input being for example higher than that present at the output, the transistors 182 and 184 are in their off state. The voltage Vgnmos applied to the gates of the two NMOS transistors 111 and 112 of the first switching module 11 is equal to the sum of the voltage present at the gate of the transistor 181 and a threshold voltage of a diode, taking into account the two diodes of the first network of diodes DN1 and the third diode.

In a case in which the voltage present at the output is much higher than that present at the corresponding input, the transistors 181 and 183 are in their off state. Consequently, the voltage Vgnmos is equal to the sum of the voltage present at the gate of the transistor 182 and a threshold voltage of a diode, taking into account the two diodes of the second network of diodes DN2 and the fifth diode.

When the voltages present at the gates of the transistors 181 and 182 are substantially identical, all four transistors 181 to 184 are in their on state and the voltage Vgnmos is equal to the sum of any one of the voltages present at the gates of the transistors 181 and 182 and a threshold voltage of a diode.

In other words, the voltage Vgnmos is equal to the sum of the highest of the voltages present at the gates of the transistors 181 and 182 and a threshold voltage of a diode.

Thus, the first control module 17 advantageously makes it possible to make the first switching module 11 fully bidirectional irrespective of the voltages present at the corresponding input INi and at the output OUT.

Nevertheless, the voltage Vgnmos is also limited by the supply voltage Vdd. If the voltage of the input signal is close to the voltage Vdd, the voltage Vgnmos will not be high enough for the NMOS transistors 111 and 112 actually to be in the on state. In this case, the first switching module 11 is in its off state and cannot transmit an input signal to the output OUT. The signal will then be transmitted by the second switching module 12.

The architecture of the second control module 14, which can be driven by the second binary drive signal BCS2 complementary to the first binary drive signal BCS1, will now be described.

The second control module 14 is supplied with a second supply voltage Vmax, which is delivered by the voltage selection circuit 8 and which, as will be seen below, is equal to the highest of the voltage Vdd and the voltages present at the corresponding input INi and at the output OUTi (Vmax=Max ($V_{INi}$, $V_{OUTi}$, Vdd)).

When the multiplexer is in a normal operating mode, that is to say supplied with the nonzero supply voltage Vdd, the voltage Vmax is equal to Vdd.

The second control module 14 has a comparator 141, the two inputs of which are coupled respectively to the first and second binary drive signals BCS1 and BCS2. The positive supply terminal is connected to the second supply voltage Vmax. The negative supply terminal is connected to the ground Vss.

A first output of the comparator 141 is connected to the gate of an extended-drain PMOS control transistor 142, of which the source is connected to the second supply voltage Vmax and the drain is connected to the sources and substrates of the two extended-drain PMOS transistors 121 and 122 of the second switching module 12.

A second output of the comparator 141 is coupled to the gates of the two PMOS transistors 121 and 122 of the second switching module 12.

When the second drive signal BCS2 has a first logical value, for example 0 V, the voltage Vgpmos of the gates of the two PMOS transistors 121 and 122 is equal to the second supply voltage Vmax and the voltage of the gate of the control transistor 142 is equal to a static value, for example equal to 12 V.

This static voltage is selected so that, when the signal BCS2 is in the high state, the transistors 121 and 122 are on for input signals close to the supply voltage Vdd, and so that the gate-source voltages of the PMOS transistors 121 and 122 do not exceed a fixed limit, for example 4.8 V.

Vmax in this case being equal to Vdd, for example 16 V, the control transistor 142 is therefore in the on state and the voltage of the sources and of the substrates of the two PMOS transistors 121 and 122 is set to the second supply voltage Vmax.

Since the voltage Vgpmos of the gates of the two PMOS transistors 121 and 122 is also equal to the second supply voltage Vmax, the second switching module of the PMOS type 12 is in the off state and the leakage currents are minimized because the gate, source and substrate voltages of the PMOS transistors 121 and 122 are set to Vdd.

When the second binary drive signal BCS2 changes to its second logical value (high state), for example 3.3 V, the voltage Vgpmos is equal to 12 V and the gate voltage of the control transistor 142 is equal to the second supply voltage Vmax (Vdd). Under these conditions, the control transistor 142 is in the off state.

The sources and substrates of the PMOS transistors 121 and 122 of the second switching module 12 are consequently rendered floating, and the second switching module of the PMOS type 12 is capable of being in the on state.

In fact, the second switching module of the PMOS type 12 is truly on only when the voltages of the input signals exceed the sum of the static voltage (12 V) and the threshold voltage of the PMOS transistors 121 and 122 of the second switching module 12.

The second switching module 12 is thus configured in order to stand in for the first switching module 11 when the voltages of the input signals are close to the first supply voltage Vdd, typically for signals of between about 13 volts and Vdd (16 volts).

Thus, depending on the voltage of the input signal, when the signals BCS1 and BCS2 respectively have their low and high logical states, either one of the two switching modules 11 and 12 is on or off and the other is off or on, or both switching modules are on.

In most cases, the first supply voltage Vdd is higher than those of the input and output signals.

However, when the analog multiplexer is in the so-called "cold spare" mode and fully turned off, the first supply voltage Vdd is equal to 0. The voltages of the input and output signals may then be higher than that of Vdd.

In order to ensure operation of the second switching module of the PMOS type 12, the switching stage 7 furthermore comprises at least one voltage selection circuit 8 such as the circuit illustrated in FIG. 3.

The voltage selection circuit 8 in this case has an additional extended-drain PMOS transistor 19, the gate of which is connected to its source by a resistor and is supplied with a current source.

The source of the additional transistor 19 is connected to all the inputs INi and to the output OUT of the switching stage 7 by seventh and eighth reverse-biased diodes D7 and D8. The source of the additional transistor 19 is intended to deliver the second supply voltage Vmax.

As explained above, when the supply voltage Vdd is higher than the highest voltage of the corresponding input and output signals, the additional PMOS transistor 19 functions as a switch and there is no voltage drop between its drain and its source. The second supply voltage Vmax is then equal to Vdd.

In the "cold spare" mode, the supply voltage Vdd is equal to 0 and the current source is therefore in the turned-off mode. The second supply voltage Vmax is then equal to the highest voltage of the input voltage present at the corresponding input INi and the output voltage minus the threshold voltage of the seventh diode D7 or of the eighth diode D8.

Thus, the highest voltage among the first supply voltage Vdd and the voltages of the input and output signals is always selected by this voltage selection circuit 8.

Figure 5:
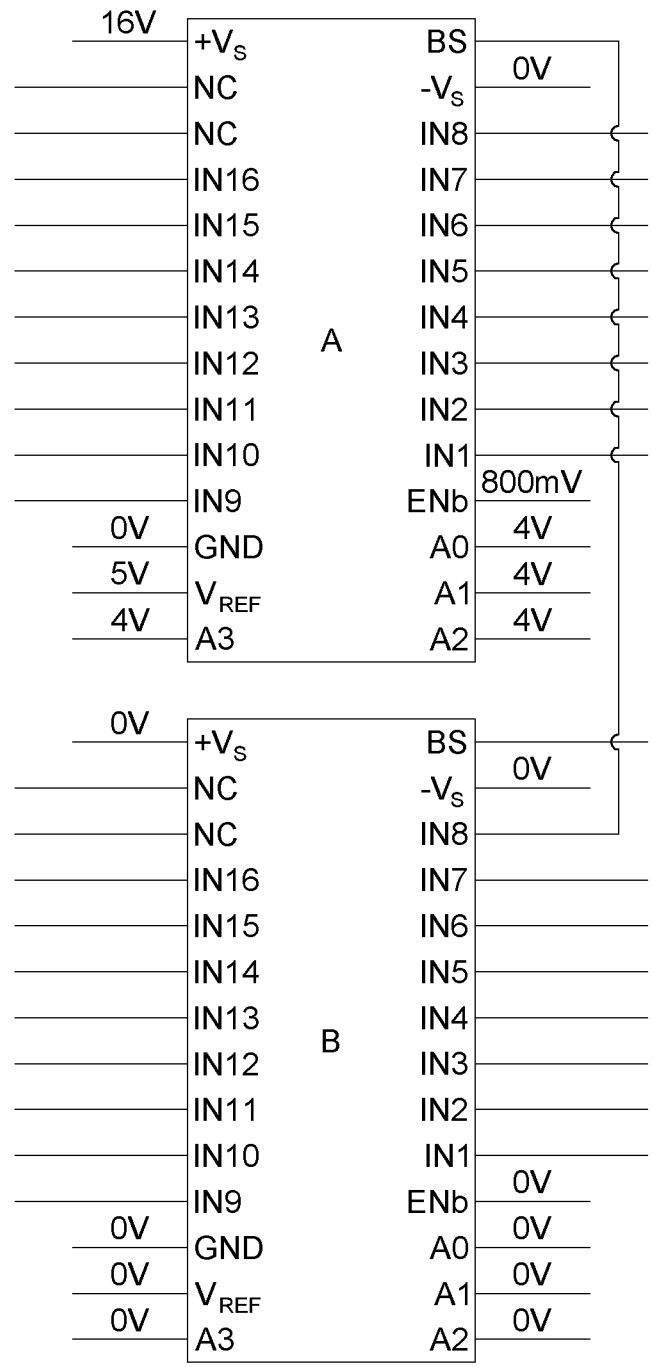

Reference will now be made to FIGS. 4 to 5 in order to illustrate a diagram of the allocation of the pins of the analog multiplexer according to the invention and an embodiment of the two analog multiplexers in the so-called "cold spare" mode.

FIG. 4 actually illustrates a diagram of the allocation of the pins of the analog multiplexer which has just been described, having 16 inputs IN1 to IN16 (corresponding to the 16 inputs IN1 to IN16 of FIG. 1) and one output OUT. The pins ADDR A0 to A3 are configured in order to receive the digital address of the channel to be processed, and the pin ENb makes it possible to activate the multiplexer. There are also pins associated with the supply voltage signals such as +Vs, −Vs, $V_{REF}$ and GND.

The so-called "cold spare" mode of the analog multiplexer B is illustrated in FIG. 5.

In this figure, one analog multiplexer A is in operation and is being supplied with the first supply voltage (Vdd=16 V), and the analog multiplexer B is fully turned off (Vdd=0 V, $V_{ENb}$=0 V).

Under these conditions, the two binary drive signals BCS1 and BCS2 are also equal to 0 V. Consequently, the second switching module of the PMOS type 12 of the multiplexer B is in its off state. As for the first switching module of the NMOS type 11, it is also in its off state since the supply voltage Vdd is equal to 0 V.

Furthermore, the leakage currents are indeed reduced by virtue of the control of the gate-source and substrate-source voltages of the transistors 111, 112, 121 and 122 of the two switching modules 11 and 12, and, as regards the second PMOS switching module 12, by virtue of the voltage selection circuit 8 which sets Vmax=Max ($V_{BEi}$, $V_{BS}$, Vdd=0).

Consequently, if the multiplexer A delivers a signal to the multiplexer B, which is fully turned off, the internal components of the multiplexer B will not be destroyed.

Furthermore, since Vmax=Max ($V_{BEi}$, $V_{BS}$, Vdd=0), and the sources and substrates of the PMOS transistors 121 and 122 of the multiplexer B are set to Vmax and the transistors 111 and 122 are off, even if a voltage is present on one of the inputs INi or on the output OUT of the multiplexer B because of a connection with a pin of the multiplexer A, any current consumption at the input and at the output of the multiplexer B is zero, to within the leaks, that is to say less than a threshold defined for example to be of the order of 0.1% of a normal current consumption in the presence of Vdd (16V).

The analog multiplexer B in the so-called "cold spare" mode will therefore not interfere with the normal operation of the analog multiplexer A.

It should be noted that the outputs of the analog multiplexers are bidirectional. One of the inputs or the output of the multiplexer A could be coupled with the output of the multiplexer B, and vice versa.

According to one aspect, it is thus possible to obtain a high-voltage analog multiplexer which can be produced with a low-voltage drive technology, is compatible with the "cold spare" mode and has good linearity of the switching modules throughout the dynamic range of the signals, in particular by virtue of the control of the gate-source voltage of the transistors of these switching modules.

The invention is not limited to the embodiments which have just been described, but encompasses all variants thereof.

Thus, although a single voltage selection circuit 8 connected to all the inputs has been described, it would be possible to provide a plurality of identical voltage selection circuits respectively allocated to a plurality of groups of inputs.

The invention claimed is:

1. An analog multiplexer, comprising:
    a plurality of inputs and one output;
    a plurality of switching circuits, each switching circuit respectively coupled between one of the inputs and the output;
    wherein each switching circuit comprises:
        a first switching module of an NMOS type, having an on state and an off state, and
        a first control module configured to receive a first supply voltage and operate to reduce the leakage currents of the first switching module when the first switching module is in its off state;
    wherein the first control module is further configured to make the first switching module bidirectional irrespective of voltages present at the corresponding input and output.

2. The analog multiplexer according to claim 1, wherein the first switching module comprises at least one NMOS transistor, and wherein the first control module comprises a first input circuit coupled to the input and to the output, said first control module configured, when the first switching module is in its on state, to deliver to a gate of the at least one NMOS transistor a first gate voltage greater than a highest of the voltages present at the input and at the output and less than the first supply voltage.

3. The analog multiplexer according to claim 2, wherein the first gate voltage is equal to a sum of said highest of the voltages present at the input and at the output and a threshold voltage of a diode.

4. The analog multiplexer according to claim 2, wherein the first switching module comprises two extended-drain NMOS transistors connected in series between the input and the output and having their sources and substrates mutually connected.

5. The analog multiplexer according to claim 4, wherein the first control module further comprises a first drive circuit responsive to a first binary drive signal and configured, when the first binary drive signal has a first logical value, to drive gates and substrates of the two extended-drain NMOS transistors of the first switching module to the ground, so as to place the first switching module in an off state.

6. The analog multiplexer according to claim 2, wherein the first control module comprises a first input circuit coupled to the input and to the output, and wherein the first input circuit comprises:
  a first extended-drain PMOS transistor having a gate coupled to the input, a drain coupled to ground and a source coupled to the first supply voltage via a first network comprising at least one diode in series with a first current source,
  a second extended-drain PMOS transistor having a gate coupled to the output, a drain coupled to ground and a source coupled to the first supply voltage via a second network comprising at least one diode in series with a second current source, wherein a cathode of the at least one diode of the second network is coupled to the gate of the at least one NMOS transistor of the first switching module,
  a third extended-drain NMOS transistor having a gate coupled to a node between the first current source and the at least one diode, a drain coupled to ground via a third diode and a third current source, and a source coupled to the first supply voltage via a fourth diode, and
  a fourth extended-drain NMOS transistor having a gate coupled to a node between the second current source and the at least one diode, a drain coupled to ground via a fifth diode and the third current source, and a source coupled to the first supply voltage via a sixth diode.

7. The analog multiplexer according to claim 1, wherein each switching circuit is coupled to the input via a first resistive circuit and to the output via a second resistive circuit, the first and second resistive circuits configured to protect each switching circuit against a short circuit at the input or at the output.

8. The analog multiplexer according to claim 1, wherein each switching circuit further comprises:
  a second switching module of a PMOS type, having an on state and an off state, the second switching module connected in parallel with the first switching module between the corresponding input and the output, and
  a second control module configured to receive a second supply voltage and operate to reduce the leakage currents of the second switching module when the second switching module is in its off state, and
  at least one voltage selection circuit configured to deliver the second supply voltage equal to the greater of the first supply voltage and the voltages present at the input and the output.

9. The analog multiplexer according to claim 8, wherein the second switching module comprises two extended-drain PMOS transistors connected in series between the input and the output and having their sources and substrates mutually connected.

10. The analog multiplexer according to claim 9, wherein the second control module is responsive to a second binary drive signal and is configured, when the second binary drive signal has a first logical value, to set gates and substrates of the two extended-drain PMOS transistors of the second switching module to the second supply voltage, so as to place the second switching module in the off state.

11. The analog multiplexer according to claim 10, wherein the second control module is furthermore configured, when the second binary drive signal has its second logical value corresponding to an on state of the second switching module, to leave sources and substrates of the two extended-drain PMOS transistors of the second switching module floating and to apply a second gate voltage, similar to the first supply voltage, to the gates of the two extended-drain PMOS transistors of the second switching module.

12. The analog multiplexer according to claim 10, wherein the first control module further comprises a first drive circuit responsive to a first binary drive signal and wherein the first binary drive signal and the secondary binary drive signal are complementary signals.

13. The analog multiplexer according to claim 8, wherein the first and second control modules are further configured, when the first supply voltage is zero, to turn off the switching modules resulting in zero current consumption at the input and at the output.

14. The analog multiplexer according to claim 8, wherein the first and second control modules are further configured, when the first supply voltage is zero, to turn off the switching modules resulting in current consumption at the input and at the output that is less than a threshold of the order of 0.1% of a normal current consumption in the presence of a nonzero first supply voltage.

15. The analog multiplexer according to claim 8, wherein the at least one voltage selection circuit comprises an additional extended-drain PMOS transistor having a gate connected to a source by an additional resistor and supplied by an additional current source, the source of the additional transistor being connected to the input and to the output by seventh and eighth reverse-biased diodes, respectively, and the extended-drain configured to output the second supply voltage.

16. The analog multiplexer according to claim 1, wherein each switching circuit is coupled to the input via a first resistive circuit and to the output via a second resistive circuit, and wherein a sum of resistances of the first and second resistive circuits is greater than or equal to four fifths of an overall resistance of the switching circuit in the on state, and the resistances of the first and second switching modules are respectively less than or equal to one fifth of the overall resistance.

17. The analog multiplexer according to claim 1, produced as an integrated circuit.

* * * * *